(12) United States Patent
Zuk

(10) Patent No.: US 6,700,433 B2
(45) Date of Patent: Mar. 2, 2004

(54) DRAIN ACTIVATED/DEACTIVATED AC COUPLED BANDPASS RF SWITCH

(75) Inventor: Philip C. Zuk, Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/385,765

(22) Filed: Mar. 11, 2003

(65) Prior Publication Data

US 2003/0169092 A1 Sep. 11, 2003

Related U.S. Application Data

(60) Provisional application No. 60/363,395, filed on Mar. 11, 2002.

(51) Int. Cl.[7] .......................... H03B 1/00; H03K 17/687
(52) U.S. Cl. ......................................... 327/427; 327/437
(58) Field of Search ................................ 327/427, 437, 327/108; 333/101, 103, 104

(56) References Cited

U.S. PATENT DOCUMENTS

| | | | |
|---|---|---|---|
| 3,872,326 A | | 3/1975 | Adams et al. .............. 307/251 |
| 5,479,610 A | * | 12/1995 | Roll-Mecak et al. ........ 324/534 |
| 5,751,168 A | * | 5/1998 | Speed, III et al. ............ 326/83 |
| 5,818,099 A | * | 10/1998 | Burghartz .................... 327/327 |
| 6,433,613 B1 | * | 8/2002 | Goodell et al. .............. 327/427 |

FOREIGN PATENT DOCUMENTS

JP            406252728       *  9/1994

* cited by examiner

*Primary Examiner*—Dinh T. Le
(74) *Attorney, Agent, or Firm*—Cesari and McKenna, LLP; Edwin H. Paul, Esq.

(57) ABSTRACT

The present application and invention provides a selectively enabled bias for the pass NMOS transistor (10) of an RF switch. Two bias supplies are selectively switched to connect to the source of the NMOS transistor (10). The first higher bias supply turns the NMOS transistor (10) off and the second lower bias supply turns the NMOS transistor (10) on. The selective switch performs a single pole double throw function and may include PMOS transistors (14, 16) with inverse logic signals connected respective gates. Diodes may be used between the PMOS and the NMOS gate to reduce the capacitance load at the NMOS gate. The bias circuitry provides for lower capacitance values in the NMOS transistor (10) for reducing insertion loss, and lower parasitic input to output capacitance thereby providing better isolation when the switch is off. Moreover, when the switch is on the source to substrate and the drain to substrate capacitances are decreased thereby providing better high frequency isolation.

10 Claims, 5 Drawing Sheets

SCHEMATIC 2

DRAIN ACTIVATED/DEACTIVATED AC COUPLED BANDPASS RF SWITCH

CROSS-REFERENCE TO RELATED APPLICATIONS

The present application claims the benefit of U.S. Provisional Patent Application Ser. No. 60/363,395, which was filed on Mar. 11, 2002, of common inventorship and title as the present application, and which provisional application is hereby incorporated herein by reference.

BACKGROUND OF THE INVENTION

1. Field of the Invention

The present invention relates to radio frequency (RF) switches, that is RF switches operating from about 400 MHz to more than 3 GHz or about in the L-band. Even more particularly the present invention relates to silicon CMOS RF switches.

2. Background Information

Available solid state RF switches are generally made using galium arsenide (GaAs) processes. The GaAs and possibly the silcon/germanium processes are accepted as having higher frequency responses than silicon processes (electron mobility is five to ten times higher in GaAs than in silicon). GaAs chips can be made reasonably small and handle sufficient power with switch characteristics that have made these processes acceptable L-band switches. For example NEC produces an L-band SPDT (single pole double throw) GaAs switch designated uPG152TA.

However, chips made via these processes are more costly than those made using the standard silicon processes, and the known L-band switches do not include the standard electrostatic protection devices (ESD) at the outputs due to performance degradation.

There are known RF switches made using standard silicon process, one such circuit is shown in FIG. 1. This circuit is switched on or off via the gate signal 2. Five volts at the NMOS gate turns the switch on and ground at the gate turns the switch off.

Ideally an on switch would have zero channel and substrate resistances and the parasitic capacitance from the source, the drain and between the source and drain would be zero as would the stray inductances. The approach toward the ideal has been to scale the switch down to minimize the capacitance but allowing the channel and substrate resistances to increase. The tradeoff results in a capacitance between the drain and source that is not small enough therefore passing too much signal when the switch was off.

It is an object of the present invention to provide an RF switch using silicon processes with better OFF isolation and insertion loss, and that will accommodate a standard ESD pad at the switch output.

SUMMARY OF THE INVENTION

In view of the foregoing background discussion, the present invention provides an NMOS transistor switch with its source biased to a reference level. The NMOS switch gate is biased high (on), thereby passing the RF signal when $Vgs>Vt$ and off when $Vgs<Vt$ thereby preventing the RF signal from passing. A lower bias voltage level (less than Vg) is applied to the source turning it on, and a second bias voltage level close to Vg ($Vg-Vs<Vt$) is applied to turn off the NMOS switch.

The higher and lower bias voltages are selectively applied in response to a logic on/off signal. There is a switch that performs a single pole double throw function to connect the higher or the lower bias signals to the source of the NMOS. The switch is preferably two PMOS transistors with inverse logic drives to their respective gates to turn only one of the PMOS switches on at a time. Diodes may be connected between the PMOS switches and the source of the NMOS.

In contrast to known RF switches, the RF output in the present invention may be connected to an ESD device with insubstantial performance degradation.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 2:
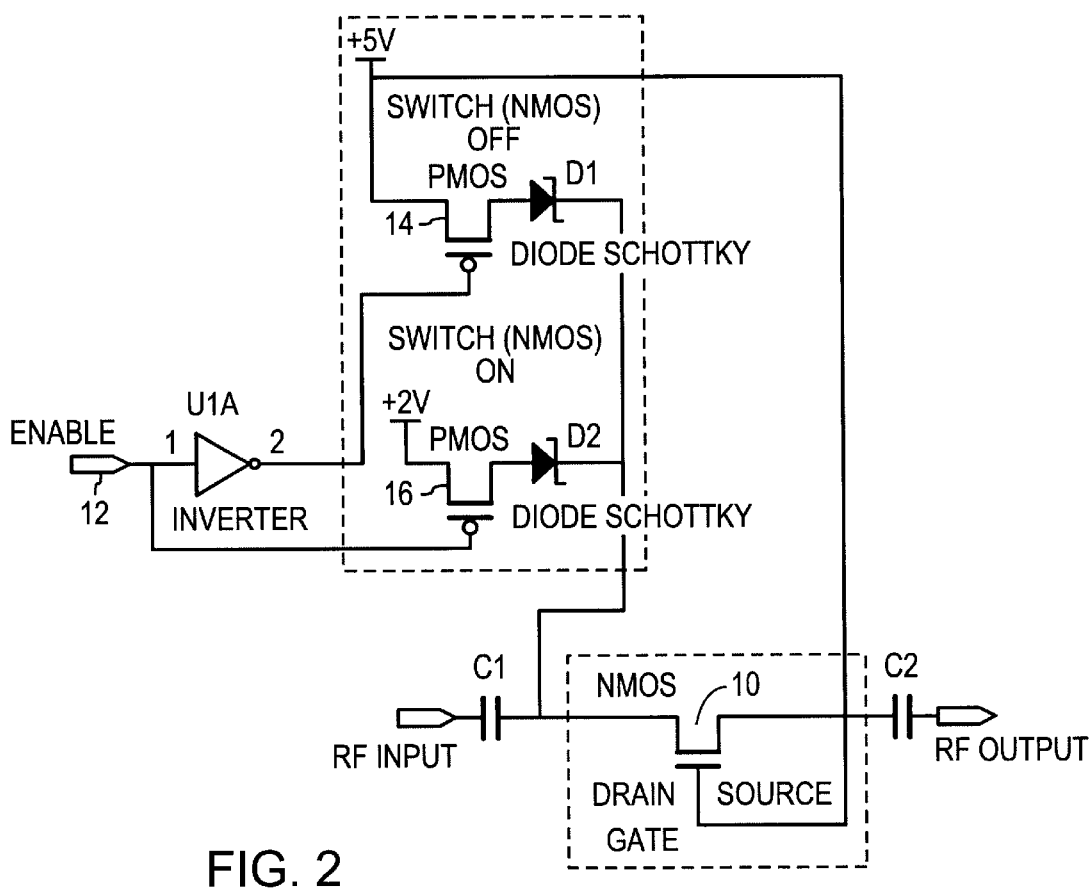
FIG. 2 is a schematic embodying the present invention.

The FIG. 2 schematic shows the basic circuit as a single pole single throw (SPST) switch—that is an on/off switch. The RF input signal is fed through an external 47 pF capacitor to the NMOS switch 10. When the NMOS switch is on, the signal is transferred out the source lead through another 47 pF capacitor to an RF output node.

There is an enable control signal 12 which is inverted so that complementary enable signals are fed to two PMOS switches 14 and 16. When the enable signal 12 is high the gate of PMOS 16 is high turning PMOS 16 off, and the gate of PMOS 14 is low turning PMOS 14 on. Five volts is diminished by the 0.3 volt drop across the Schottky diode D1 with the +4.7 volts applied to the drain of NMOS 10. The gate of NMOS 10 is biased directly to +5 volts and the 0.3 volts across the schottky diode will reliably maintain the NMOS 10 in the off condition. When the enable signal goes low, PMOS 16 is on and PMOS 14 is off. The drain of NMOS 10 will be at +1.7 volts via the 0.3 volt drop across Schottky diode D2. In this instance the drain to gate voltage on NMOS 10 will be +3.3 volts that will reliably maintain NMOS 10 in the on condition. In this case the threshold voltage (Vt) for the NMOS 10 is about 1.0 volts.

The Schottky diodes D1 and D2 are used to provide, when the diodes are off, a smaller capacitance than would the PMOS 14 and 16 drains. This will reduce somewhat the insertion loss when using the circuit in practical applications.

Figure 3:
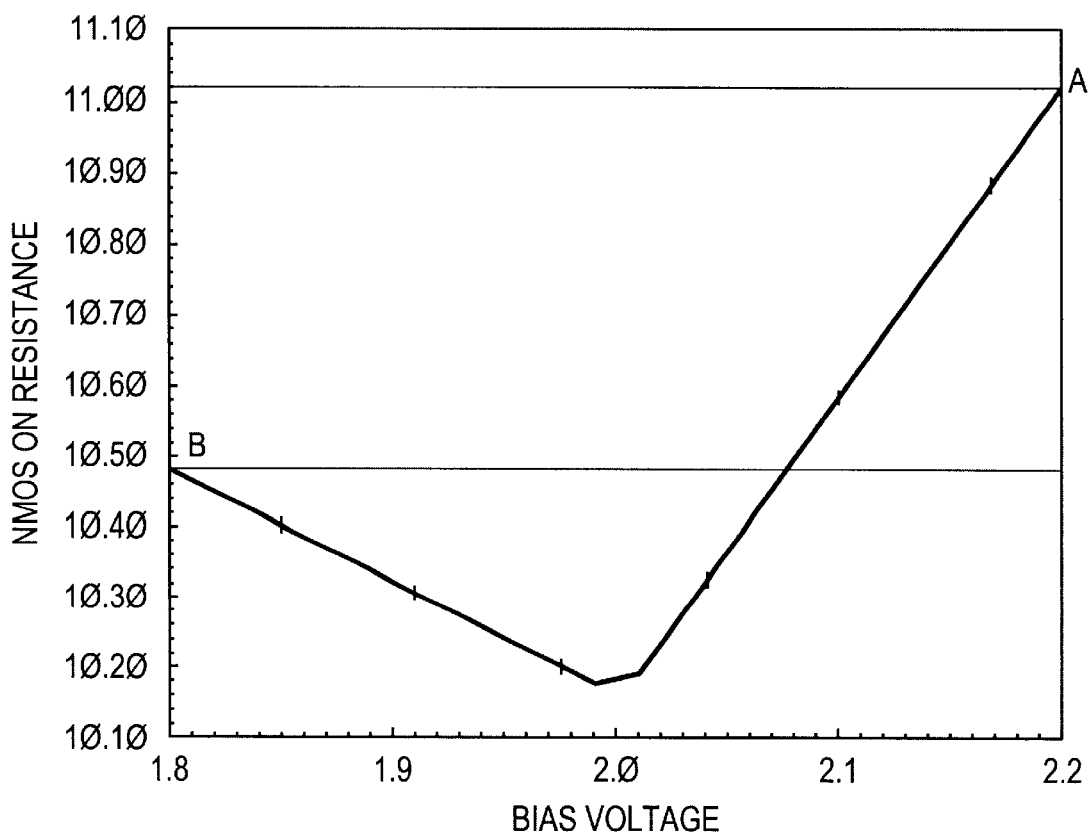
FIG. 3 is chart of on switch resistance for a preferred embodiment.

FIG. 3 shows the variation of the on resistance of the NMOS transistor with respect to the bias voltage for one preferred embodiment. As can be seen a low value of 10.2 ohms is achieved with the bias at about 2.0 volts but the on resistance remains below 10.5 ohms over a range from 1.8 to about 2.1 volts.

When the NMOS 10 is "off", it is important to have a low parasitic capacitance. Low source to drain capacitance values will provide better isolation at RF frequencies, and lower source and drain to substrate capacitances will reduce insertion losses.

Figure 1:
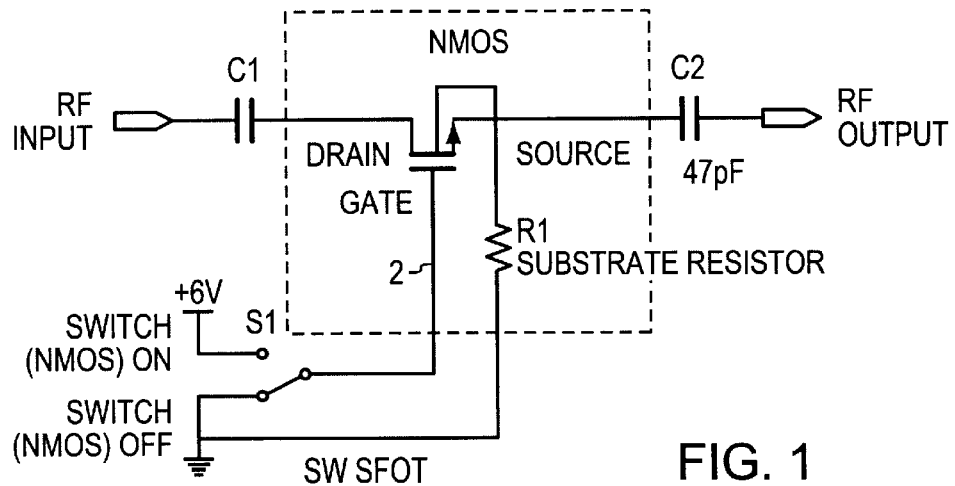
FIG. 1 is a schematic of a prior art gate activated RF switch.
Figure 4A:
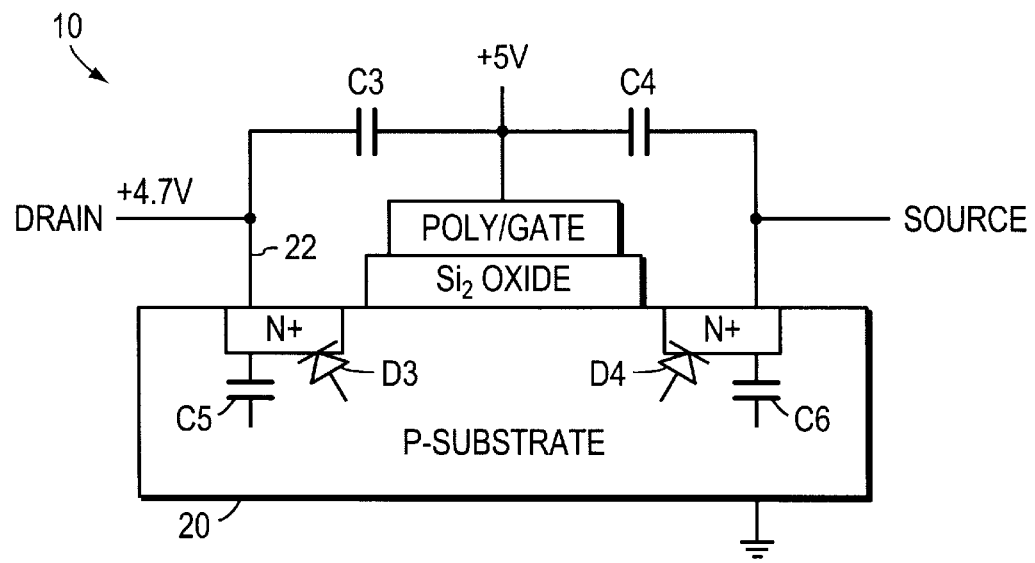
FIGS. 4A and 4B are diagrams of the NMOS switch showing some detail.
Figure 4B:
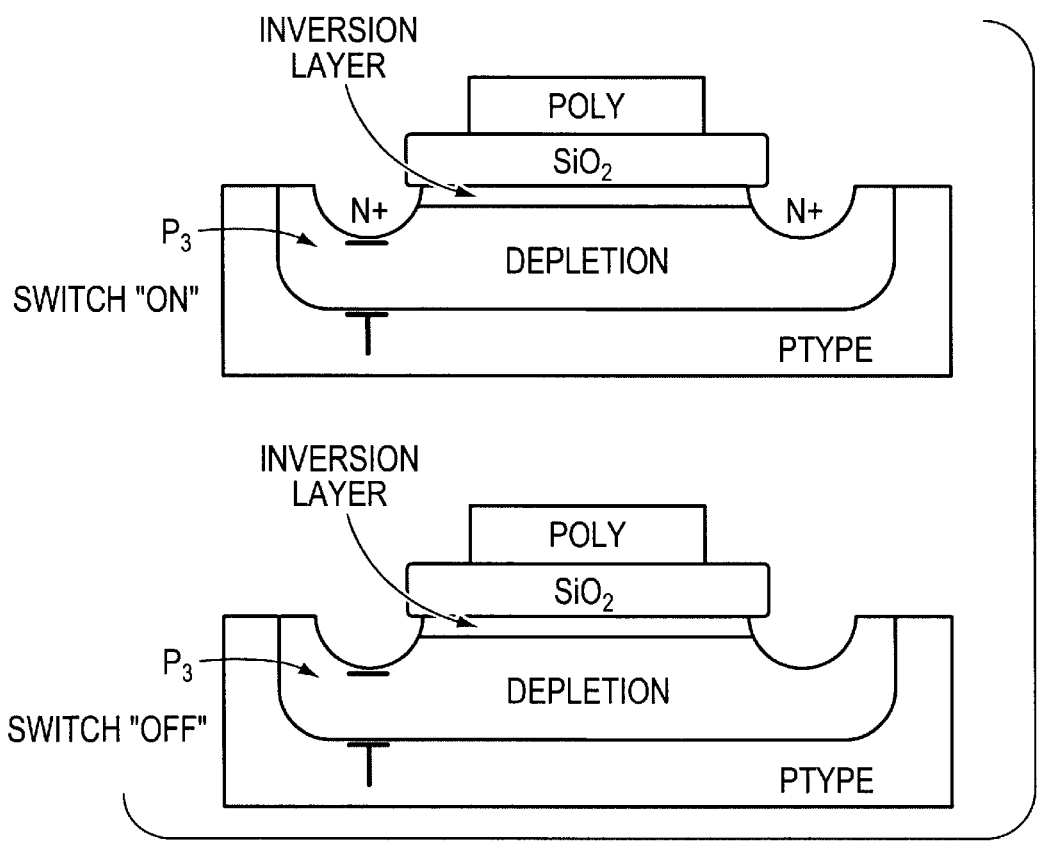

FIG. 4A illustrates the parasitic capacitances inherent to the NMOS transistor 10 when the NMOS is biased off. Ideally, to minimize signals passing through the NMOS switch when it is biased off, the resistance from the source to the drain should be as high as possible, and the capacitance from the drain to the source should be as low as possible. The gate is at +5 volts and the source 22 is at +4.7 volts. To switch off the NMOS the source is driven to +4.7 volts with the gate at +5 volts. When the NMOS is "on," the source and drain voltages are about equal, when the source is switched to +4.7 volts the drain will be driven up to the +4.7 volts less the channel resistance of the NMOS. This will switch off the NMOS and the drain will float, but practically remain off. In this condition the source to substrate reverse biased diode D3 enlarges its depletion region, as shown in FIG. 4B, thereby reducing the capacitance associated with the diode. So maximizing this reverse bias voltage produces a low value for the capacitance C5. Also, FIG. 4A shows capacitance C3 from the source to the gate and C4 from the gate to the drain. Since the gate is biased to the low impedance +5 volt power rail C3 and C4 are both shunted to that low impedance thereby minimizing the effective capacitance from the source to the drain. With the source, gate and drain all near +5 volts and the substrate at ground, the parasitic capacitances C3–C6 are minimized thereby maximizing the switch off impedance and therefore maximizing switch isolation. Turning the device on or off in this manner allows the designer to use a smaller NMOS than in the prior art (FIG. 1) thereby keeping the overlap capacitance (C3 & C4) to a minimum helping the off-isolation.

Figure 5:
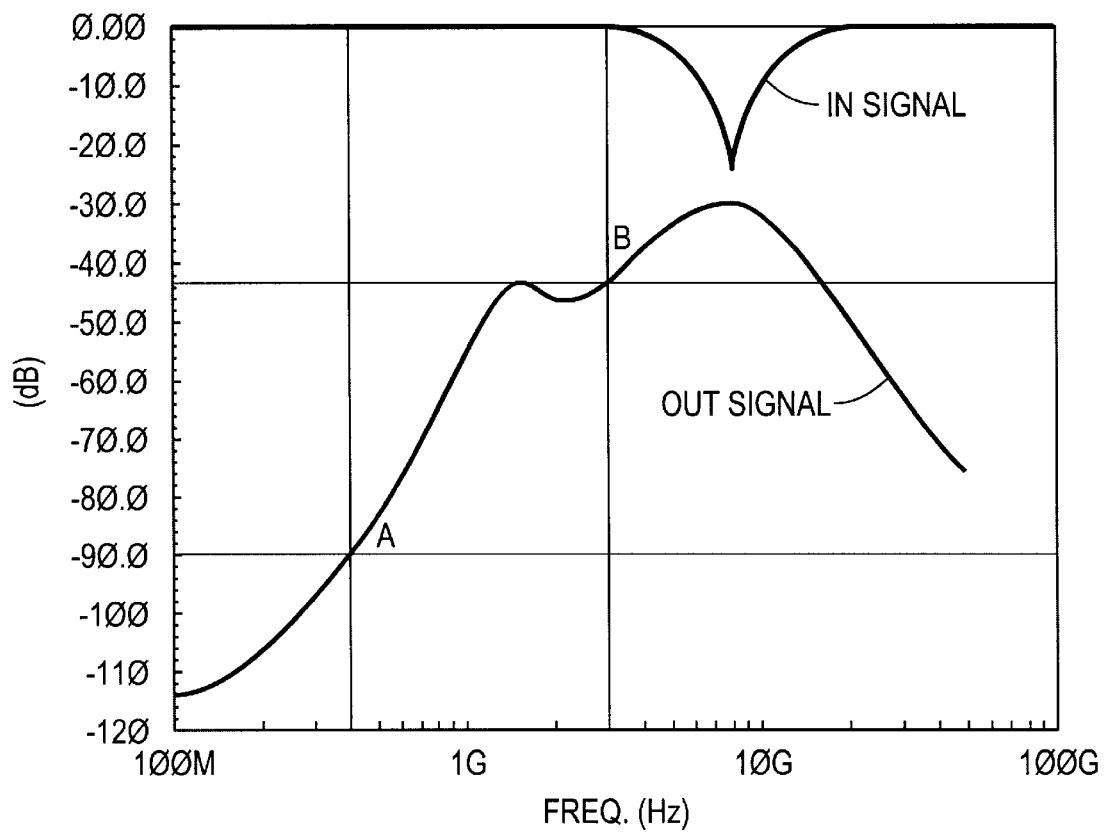
FIG. 5 is a chart of an off switch isolation for a preferred embodiment.

FIG. 5 charts over RF frequencies the isolation of a preferred embodiment of the present invention with a reverse bias on the NMOS switch of 4.5 volts. By inspection, the difference between the input signal and the output signal up to about 3 GHz is at least 40 dB or 100 to 1 attenuation. Stated another way less than 1% of the input signal passes through the off NMOS switch.

Figure 6:
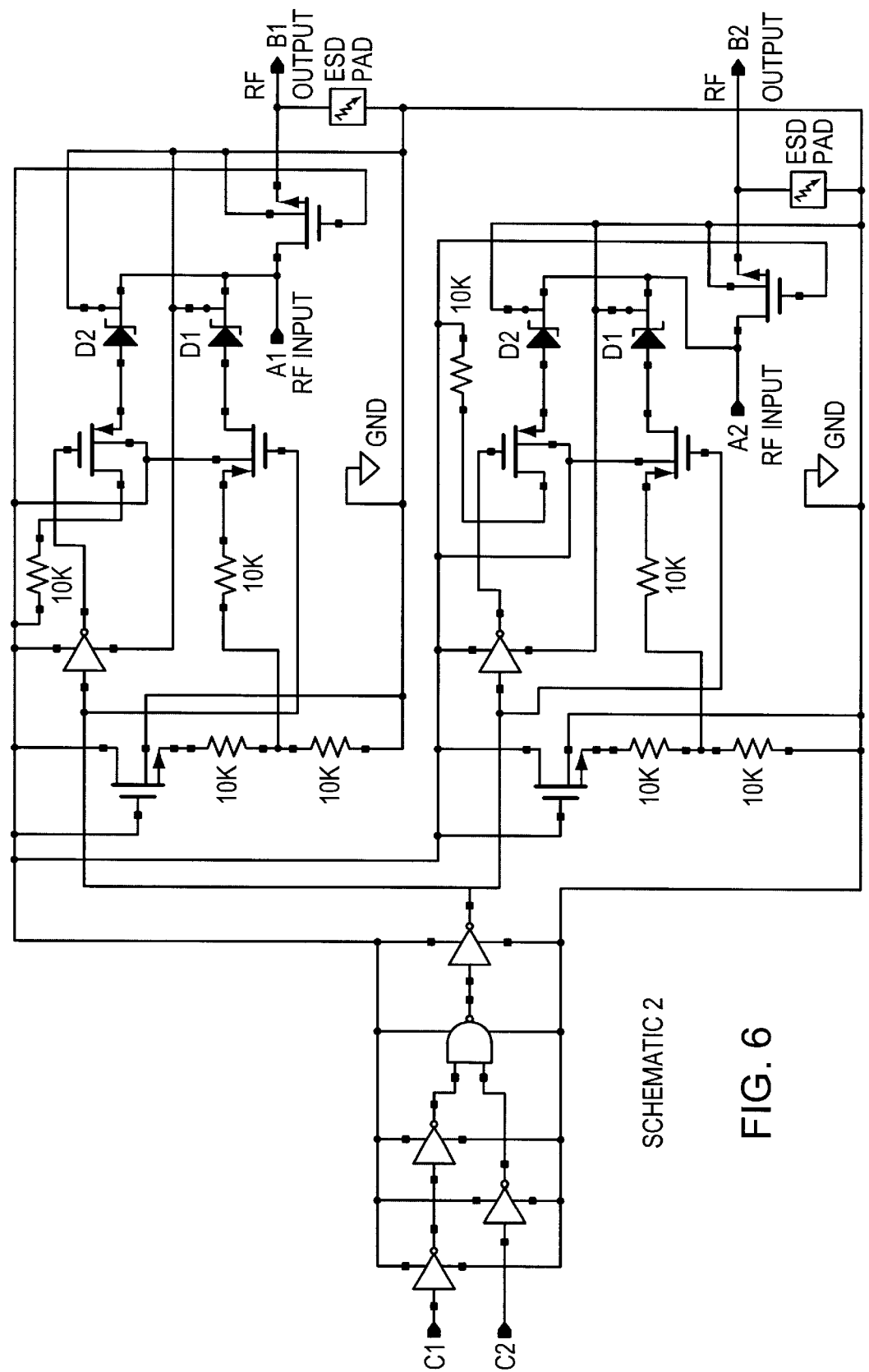
FIG. 6 is a practical schematic embodying preferred embodiments of the present invention.

FIG. 6 shows a practical schematic utilizing two single pole single throw switches. In one typical application these switches are arranged to effect a single pole double throw RF switch by connecting the inputs together. The added circuitry around M2 and M21 provides for the +2 volt reference supply needed to bias on the NMOS switches M8 and M11, respectively. The enable gating can be arranged as shown but other logic circuits and other logic combination can be used to advantage.

FIG. 6 also shows ESD pads 148 and 149 attached to the outputs. Such pads are not found on other known RF switches due to the pads' impedance (added capacitances) reducing the effective RF switch characteristics to the point of the switch being ineffective and/or uncompetitive. That is, if the on resistance of the switch is too high, the pad's capacitance will roll of the RF response too much. The present invention provides reduced on resistances and reduced parasitic capacitances thereby allowing use of standard ESD pads. Moreover, the impedances provided by the present invention help protect the circuitry of ESD events as well. Such standard ESD pads are well known in the art.

As known in the art the present invention may be implemented with other types of solid state switches, diodes, bipolar transistors, etc. Moreover, even mechanical relay switches could be used. Also, in some applications resistors may be utilized to replace or along with diodes. Also as known in the art, N-type transistors may be replaced with P-types in the present invention.

It should be understood that above-described embodiments are being presented herein as examples and that many variations and alternatives thereof are possible. Accordingly, the present invention should be viewed broadly as being defined only as set forth in the hereinafter appended claims.

Note: As known from prior art, the source and drain are interchangeable on a MOSFET.

What is claimed is:

1. An RF switch for selectively transferring an RF signal from an input node to an output node, the RF switch comprising:

an NMOS transistor defining a gate that is biased to a reference voltage level, the NMOS defining a source and a drain of the NMOS transistor, wherein one of the source and the drain defines the input node and the other the output node, and wherein the RE signal is applied to the input node, and, wherein when the NMOS transistor is on, the RE signal is passed to the output node, and, when the NMOS transistor is off, the input node is isolated from the output node, a first bias supply and a lower voltage second bias supply, wherein the both bias supplies are lower than the reference voltage level, a first switch defining a first state and a second state, the switch arranged between and connecting input node to the first bias supply in the first state and connecting the input node to the second bias supply in the second state, wherein in the first state the NMOS transistor is off and in the second state the NMOS transistor is on.

2. The RE switch of claim 1 wherein the first switch comprises a solid state switch.

3. The RE switch of claim 2 wherein the solid state switch comprises:

a first PMOS switch and a second PMOS switch, each PMOS defining a gate, source and drain;

a logic enable signal connected to the gate of the first PMOS switch that turns the first PMOS switch on and off, the logic inverse of the first logic enable connected to the gate of the second PMOS switch, and wherein the first PMOS defines a first node connected to the first bias supply, and the second PMOS defines a second node connected to the second bias supply, and wherein a second node of the first PMOS is connected to the anode of a first diode, and a second node of the second PMOS is connected to the anode of a second diode, and where the cathodes of the first and the second diodes are connected to each other and to the gate-input node of the NMOS transistor.

4. The RF switch of claim 3 wherein the diodes are Schottky diodes.

5. The RF switch of claim 1 further comprising an electrostatic protection device attached to the output node of the RF switch.

6. A method for selectively transferring an RF signal from an input node to an output node, the method comprising the steps of:

biasing the gate of an NMOS transistor to a reference voltage level, defining a source and a drain of the NMOS transistor, wherein one of the source and the drain define the input node and the other the output node, applying the RF signal to the input node, and, when the NMOS transistor is on, the RF signal is passed to the output node, and, when the NMOS transistor is off, the input node is isolated from the output node, defining a first bias supply and a lower voltage second bias supply, wherein both the first and the second bias supplies are lower than the reference voltage level, defining a first state and a second state of a first switch arranged between and connecting the input node to the first bias supply in a first state and connecting the input node to the second bias supply in the second state, wherein in the first state the NMOS transistor is on, and in the second state the NMOS transistor is off.

7. The method of claim 6 wherein the first switch comprises a solid state switch.

8. The method of claim 7 further comprising the steps of:

providing a first PMOS switch and a second PMOS switch, each PMOS defining a gate, source and drain;

connecting a logic enable signal to the gate of the first PMOS switch that turns the first PMOS switch on and off, providing the logic inverse of the first logic enable signal connected to the gate of the second PMOS switch, and wherein the first PMOS defines a first node connected to the first bias supply, and the second PMOS defines a second node connected to the second bias supply, and wherein a second node of the first PMOS is connected to the anode of a first diode, and a second node of the second PMOS is connected to the anode of a second diode, and where the cathodes of the first and the second diodes are connected to each other and to the input node of the NMOS transistor.

9. The method of claim 8 wherein the diodes are Schottky diodes.

10. The method of claim 6 further comprising the step of attaching an electro static protection device to the output node of the RF switch.

* * * * *